United States Patent
Wang et al.

(10) Patent No.: US 12,062,401 B2
(45) Date of Patent: Aug. 13, 2024

(54) PERFORMING BLOCK-LEVEL MEDIA MANAGEMENT OPERATIONS FOR BLOCK STRIPES IN A MEMORY DEVICE

(71) Applicant: Micron Technology, Inc., Boise, ID (US)

(72) Inventors: Wei Wang, Dublin, CA (US); Seungjune Jeon, Santa Clara, CA (US); Yang Liu, Boise, ID (US); Charles See Yeung Kwong, Redwood City, CA (US)

(73) Assignee: Micron Technology, Inc., Boise, ID (US)

( * ) Notice: Subject to any disclaimer, the term of this patent is extended or adjusted under 35 U.S.C. 154(b) by 84 days.

(21) Appl. No.: 17/892,437

(22) Filed: Aug. 22, 2022

(65) Prior Publication Data

US 2024/0062839 A1    Feb. 22, 2024

(51) Int. Cl.
*G11C 16/04* (2006.01)
*G11C 16/34* (2006.01)

(52) U.S. Cl.
CPC ...... *G11C 16/3431* (2013.01); *G11C 16/0483* (2013.01)

(58) Field of Classification Search
CPC ............ G11C 16/3431; G11C 16/0483; G11C 2029/0409; G11C 2029/0411; G11C 29/52; G11C 16/3418

USPC ...................................................... 365/185.09
See application file for complete search history.

(56) References Cited

U.S. PATENT DOCUMENTS

| | | | |
|---|---|---|---|
| 10,902,924 B2 * | 1/2021 | Park ..................... | G11C 16/349 |
| 11,282,564 B1 * | 3/2022 | Rayaprolu ........ | G11C 29/50004 |
| 2017/0076811 A1 * | 3/2017 | Reusswig ............. | G11C 16/349 |
| 2019/0325969 A1 * | 10/2019 | Hong ................... | G11C 29/028 |

* cited by examiner

Primary Examiner — Tha-O H Bui
(74) Attorney, Agent, or Firm — LOWENSTEIN SANDLER LLP

(57) ABSTRACT

Systems and methods are disclosed including a memory device and a processing device operatively coupled to the memory device. The processing device can perform operations comprising performing a data integrity check on a set of memory cells of a source management unit of the memory device to obtain a data integrity metric value; determining whether the data integrity metric value satisfies a first threshold; responsive to determining that the data integrity metric value fails to satisfy the first threshold, determining whether the data integrity metric value satisfies a second threshold that is lower than the first threshold; responsive to determining that the data integrity metric value satisfies the second threshold, causing the memory device to copy data from the source management unit to a destination set of pages of the memory device; and performing a subsequent data integrity check on one or more invalid pages of the source management unit.

20 Claims, 4 Drawing Sheets

PERFORMING BLOCK-LEVEL MEDIA MANAGEMENT OPERATIONS FOR BLOCK STRIPES IN A MEMORY DEVICE

TECHNICAL FIELD

Embodiments of the disclosure relate generally to memory sub-systems, and more specifically, relate to performing block-level media management operations for block stripes in a memory device.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
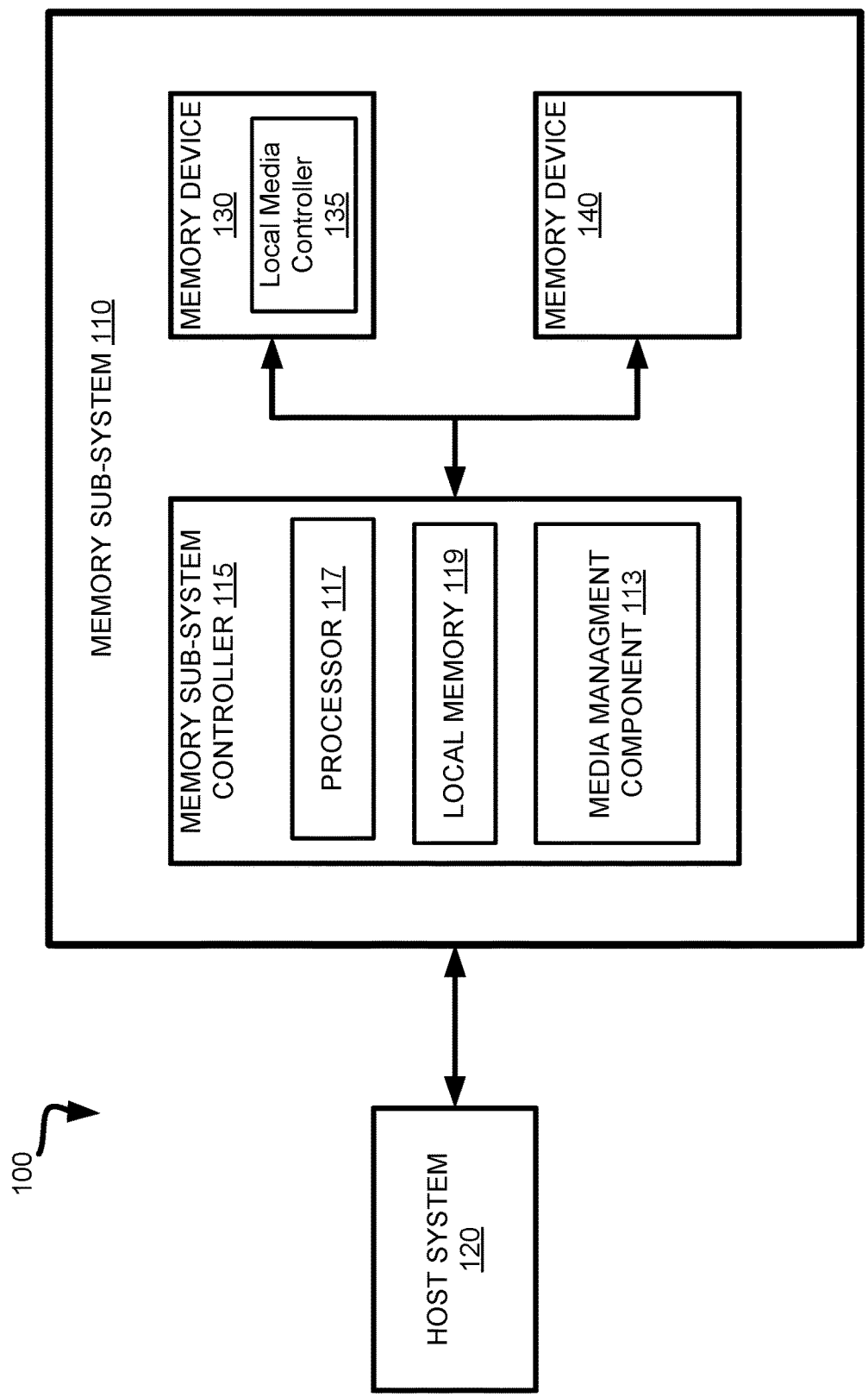
FIG. 1 illustrates an example computing system that includes a memory sub-system, in accordance with some embodiments of the present disclosure.

Aspects of the present disclosure are directed to performing block-level media management operations for block stripes in a memory device. A memory sub-system can be a storage device, a memory module, or a combination of a storage device and memory module. Examples of storage devices and memory modules are described below in conjunction with FIG. 1. In general, a host system can utilize a memory sub-system that includes one or more memory components, such as memory devices that store data. The host system can provide data to be stored at the memory sub-system and can request data to be retrieved from the memory sub-system.

A memory sub-system can utilize one or more memory devices, including any combination of the different types of non-volatile memory devices and/or volatile memory devices, to store the data provided by the host system. In some embodiments, non-volatile memory devices can be provided by negative-and (NAND) type flash memory devices. Other examples of non-volatile memory devices are described below in conjunction with FIG. 1. A non-volatile memory device is a package of one or more dice. Each die can include one or more planes. A plane is a portion of a memory device that includes multiple memory cells. Some memory devices can include two or more planes. For some types of non-volatile memory devices (e.g., NAND devices), each plane includes a set of physical blocks. Each block includes a set of pages. "Block" herein shall refer to a set of contiguous or non-contiguous memory pages. An example of a "block" is an "erasable block," which is the minimal erasable unit of memory, while "page" is a minimal writable unit of memory. Each page includes a set of memory cells. A memory cell is an electronic circuit that stores information.

As described above, a die can contain one or more planes. A memory sub-system can use a striping scheme to treat various sets of data as units when performing data operations (e.g., write, read, erase, etc.). A die stripe refers to a collection of planes that are treated as one unit when writing, reading, or erasing data. A controller of a memory device (i.e., a memory sub-system controller, a memory device controller, etc.) can execute the same operation, in parallel, at each plane of a dice stripe. A block stripe is a collection of blocks, at least one from each plane of a die stripe, that are treated as a unit. The blocks in a block stripe can be associated with the same block identifier (e.g., block number) at each respective plane. A page stripe is a set of pages having the same page identifier (e.g., the same page number), across a block stripe, and treated as a unit.

A host system can initiate a memory access operation (e.g., a programming or write operation, a read operation, an erase operation, etc.) on a memory sub-system. For example, the host system can transmit a request to a memory sub-system controller, to program data to and/or read data from a memory device of the memory sub-system. Such data is referred to herein as "host data." The memory sub-system controller can execute one or more operations to access the host data in accordance with the request. Host data can be encoded using error-correcting code (ECC)) to correct data errors that can occur during transmission or storage. In particular, the host data can be encoded using redundancy metadata (e.g., parity data such as one or more parity bits) to form a codeword. The parity data allows the memory sub-system controller to detect a number of errors that may occur anywhere in the host data, and often to correct these errors without retransmission.

As data is repeatedly accessed at a memory cell of a memory device, the memory cell can deteriorate and eventually become defective. For example, when a host system initiates too many memory access operations for host data stored at a memory device, the memory cells that store the host data, as well as the adjacent memory cells at the memory device, can become corrupted. In some instances, a memory access operation (e.g., a read operation, etc.) performed by a memory sub-system controller to access data at one or more memory pages of a plane of a memory device can fail. Such failure is referred to herein as a memory access failure.

A memory sub-system can support a redundancy mechanism to protect host data against memory access failures. For example, for a NAND type flash device, the memory sub-system can implement redundant array of independent NAND (RAIN) operations to provide redundancy for the data stored on the memory sub-system. When host data (or one or more codewords) is received from the host system to be programmed to a memory device of the memory sub-system, a memory sub-system controller can generate redundancy metadata based on one or more exclusive-or (XOR) operations with the received host data and can use the redundancy metadata to reconstruct or recalculate the host data in the event of a failure of a portion of the memory device that is storing host data. As an example, the memory sub-system controller can generate one or more RAIN codewords (redundancy metadata) based on an XOR operation applied to host data stored at a particular number of data locations of one or more logical units (LUNs) (e.g., a page, a block) of the memory sub-system. If a portion of a memory device storing the host data fails and the corresponding data is lost or corrupted, the memory sub-system controller can reconstruct the lost or corrupted data based on an XOR operation among the rest of the host data and the redundancy metadata.

In some systems, a memory sub-system can routinely perform data integrity checks to verify that the data stored at the block can be reliably read. In an example, the memory sub-system controller can select a block and perform the data integrity check on some to all of the pages of the block. During the data integrity check, which can measure and collect information about error rates associated with data, values of a data state metric are determined for data stored at the block. "Data state metric" herein shall refer to a quantity that is measured or inferred from the state of data stored on a memory device. Specifically, data state metrics may reflect the state of the temporal voltage shift, the degree of read disturb, and/or other measurable functions of the data state. A composite data state metric is a function (e.g., a weighted sum) of a set of component state metrics. One example of a data state metric is bit error count (BEC). Another example of a data state metric is residual bit error rate (RBER). The RBER corresponds to a number of bit errors per unit of time that the data stored at the data block experiences (e.g., BEC/total bits read).

A data state metric value exceeding a transfer threshold criterion can trigger a media management operation (e.g., a folding operation). The folding operation involves copying data from a source management unit (e.g., a block, superblock, a page, etc.) to an available management unit on the memory device. In some systems, a single block triggering the media management operation includes the memory sub-system controller performing a media management operation on all of the blocks of a block stripe due to the redundancy metadata (e.g., RAIN codeword(s)) being derived from all of the blocks of the block stripe. However, folding entire block stripes causes the memory sub-system controller to transfer data from good blocks (blocks storing data that can be reliably read), which decreases overall system efficiency and increases overall system latency and overhead.

Further, in some systems, performing a media management operation on a block causes the memory sub-system controller to mark the block as a candidate for a media management operation (e.g., a garbage collection operation). Garbage collection is a process to recover free space by relocating pages with data to new blocks, and erasing old blocks. Specifically, a block can include valid data pages and data pages that are no longer needed (e.g., stale pages).

Garbage collection generally involves copying only the valid data pages from a source block to a destination block and then erasing the source block to free the space. As such, by erasing the data on the block, the redundancy metadata for the corresponding block stripe is compromised.

Aspects of the present disclosure address the above and other deficiencies by enabling memory sub-systems to perform media management operations on individual blocks of a block stripe without compromising the redundancy metadata. In particular, the memory sub-system controller can perform a data integrity check on a source block to verify that the error rate is below a predetermined threshold criteria (a block transfer threshold criterion and a stripe transfer threshold criterion). The stripe transfer threshold criterion can be used to determine whether the data of the entire block stripe is at risk of becoming unrecoverable (e.g., the error rate on the block is close to a level where error correction operations will not be able to recover the stored data, thus nullifying the ability of the redundancy codeword to recover data for other blocks of the block stripe). The block transfer threshold criterion can be used to determine whether the data of the source block has a relatively significant amount of errors, and needs to be corrected or refreshed, but the amount of errors is not significant enough to be at risk of becoming unrecoverable. As such, the block transfer threshold criterion can be set to a value lower than the stripe transfer threshold criterion. If the value of the data integrity metric satisfies the stripe transfer threshold criterion, the memory sub-system controller triggers a media management operation on each block of the block stripe.

If the value of the data integrity metric satisfies the block transfer threshold criterion (but not the stripe transfer threshold criterion), the memory sub-system controller triggers a media management operation on the source block. The media management operation (e.g., a folding operation) can copy the data stored on the valid pages of the source block to one or more available blocks of the memory sub-system. A valid page is a physical memory page that is mapped, by a physical-to-logical (P2L) metadata to a logical address. The memory sub-system controller can mark all of the pages of the source block as invalid. In particular, each page of the source block is marked as invalid (e.g., not mapped to a logical address) in a look-up table, and the data from each invalid page has been transferred to a new page which is mapped to a respective logical address. Although the source block no longer includes valid pages, the data stored on the source block can be used in error correction operations for other blocks on the block stripe (e.g., in a RAIN scheme). As such, the processing logic can continue to perform data integrity checks on the source block to determine whether a value of the data integrity metric satisfies the stripe transfer threshold criterion. In addition, since the data on the source block can be used for error correction operations for the other blocks in the block stripe, the memory sub-system controller does not mark the source block as a candidate for garbage collection operations or other space recovery operations.

Advantages of the systems and methods implemented in accordance with some embodiments of the present disclosure include, but are not limited to, a reduction in complexity and improvement in performance of transferring source data stored on a block of a block stripe without compromising the redundancy metadata generated for the block stripe. This increase in performance includes reduced latency, particularly by enabling the memory sub-system controller to fold a single block of a block stripe instead of the entire block stripe. Other advantages will be apparent to those skilled in the art of folding data within memory devices, which will be discussed hereinafter. Although embodiments are described using blocks of a NAND flash memory, aspects of the present disclosure can be applied to other types of memory sub-systems.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a combination of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to multiple memory sub-systems 110 of different types. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAIVI), oxide based RRAM (OxRAM), negative-or (NOR) flash memory, or electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., a logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which is a raw memory device 130 having control logic (e.g., local controller 132) on the die and a controller (e.g., memory sub-system controller 115) for media management within the same memory device package. An example of a managed memory device is a managed NAND (MNAND) device.

The memory sub-system 110 includes a media management component 113 that can manage data stored in memory device 130, 140. In some embodiments, the memory sub-system controller 115 includes at least a portion of the media management component 113. For example, the memory sub-system controller 115 can include a processor 117 (processing device) configured to execute instructions stored in local memory 119 for performing the operations described herein. In some embodiments, the media management component 113 is part of the host system 120, an application, or an operating system.

Figure 2:
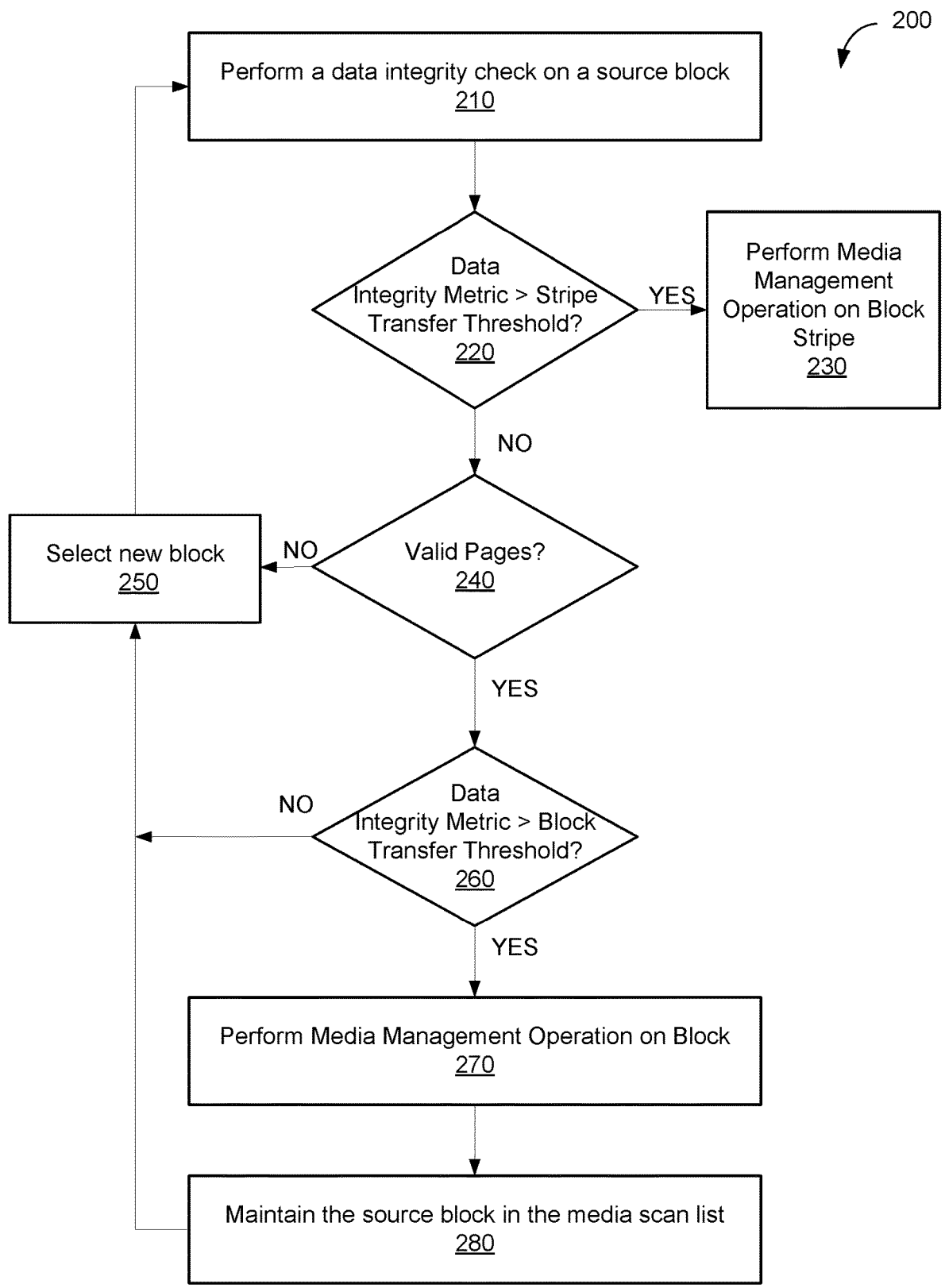
FIG. 2 is a flow diagram for performing media management operations on data stored on a block stripe, in accordance with some embodiments of the present disclosure.

FIG. 2 is a flow diagram of an example method 200 for performing media management operations on data stored on a block stripe, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the media management component 113 of FIG. 1. In other or similar embodiments, one or more operations of method 200 is performed by another component of the memory sub-system controller 115, or by a component of local media controller 135. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

The operations of method 200 are directed to determining whether to perform a media management operation on a single block of a block stripe, or on the entire block stripe. The media management operation can involve transferring data from a source block to one or more destination blocks, or from the blocks of a block stripe to one or more destination blocks (or one or more destination block stripes). Although the operations of method 200 are discussed with reference to blocks, it is noted that the operations of method 200 can be performed with respect to other types of management units, such as a super block, a page, etc.

At operation 210, the processing logic performs a data integrity check on a source block of a block stripe. The source block can be selected randomly, as the next block on a media scan list (i.e., a list of blocks to check as part of maintenance operations), etc. The processing logic can perform the data integrity check on at least a subset of the pages of the source block. In some embodiments, the data integrity check can include reading data from the set of sampled memory cells in the source block. In some embodiments, the set of sampled memory cells in the source block can be one or more memory cells of the block, a page, a group of pages in the block, a wordline, a group of wordlines in the block, or any combination thereof. In some embodiments, the set of sampled memory cells can be selected randomly, can be a predetermined group (e.g., the first, twentieth, and fortieth wordlines of a block), can be a rotating group, etc.

The data integrity check can verify that the data stored at memory cells does not include any errors, or that the number of errors are below a predetermined threshold. During a scan operation, the processing logic identifies one or more data integrity metrics, such as the bit error count (BEC) or the raw bit error rate (RBER), representing a number of bit errors per unit of time that the data stored at the data block experiences. In some embodiments, during the data integrity check, the processing logic reads a raw codeword (e.g., a series of a fixed number of bits) from the page. The processing logic can feed the raw codeword to an error correcting code (ECC) decoder to generate a decoded codeword and compare the decoded codeword to the raw codeword. The processing logic can count the number of flipped bits between the decoded code word and the raw code word, with a ratio of the number of flipped bits to the total number of bits in the code word representing the RBER.

At operation 220, the processing logic determines whether a value of the data integrity metric (e.g., a BEC value, a RBER value, etc.) satisfies a stripe transfer threshold criterion (e.g., meets or exceeds a threshold value, is lower than a threshold value, etc.). The stripe transfer threshold value can be set to a value reflecting the data of the entire block stripe being at risk of becoming unrecoverable. In particular, the errors in the source block can be approaching a value (determined via testing, experimentation, analytics, etc. of the memory device) where a redundancy metadata scheme (e.g., RAIN scheme) or any other error correction operation can fail to correct the errors in the source block and in any other block of the block stripe. The stripe transfer threshold criterion can be determined via testing, experimentation, or analytics of the memory device and set during manufacturing of the memory sub-system 110 or during programming and/or calibration of the memory sub-system 110. For example, during testing, an operator can determine a value at which the memory sub-system satisfies a condition (e.g., an error rate at which the error-handling operations fail to recover data from one or more blocks of the block stripe), and set the threshold value to a portion of that value (e.g., a specific percentage lower than the error rate of failure).

In some embodiments, the processing logic can determine whether an RBER value or a BEC value exceeds a chosen stripe transfer threshold value. If the data integrity metric satisfies the stripe transfer threshold criterion (e.g., BEC or RBER value is above a threshold value), the processing logic proceeds to operation 230, where the processing logic triggers a media management operation on the block stripe. If the data integrity metric fails to satisfy the stripe transfer threshold criterion (e.g., BEC or RBER value is below a threshold value), the processing logic proceeds to operation 240.

At operation 230, the processing logic performs a media management operation on the block stripe. The media management operation (e.g., a folding operation) can copy the data stored on each block of the block stripe to one or more available blocks of the memory sub-system. For example, the processing logic can write data stored on each valid page of each block of the block stripe to respective new page on one or more available physical locations (e.g., one or more available destination blocks). A valid page is a physical memory page that is mapped to a logical address in a look-up table. This available page can be selected as, for example, a page having the lowest write count, a page location having been least recently accessed, etc. A list of available physical locations can be maintained in a free pool stored in local memory 119. Upon copying the data, the processing logic records a mapping of a logical address associated with the data from the block to the available physical addresses in the look-up table. In some embodiments, the look-up table is maintained in local memory 119 of memory sub-system controller 115. Thus, when the processing logic applies the logical address to the look-up table, the corresponding physical address is output. In other embodiments, the mapping can be maintained in some other type of data structure, such as an array, linked list, etc.

In some embodiments, prior to writing the data from the source blocks to the destination block(s), the processing logic can perform one or more error correction operations on the data stored on one or more blocks of the block stripe. For example, the processing logic can perform a scan of the data by reading the data out from the memory device, decoding the source data according to an error correction code (ECC) algorithm, and performing an error check on the source data, and correcting identified error using the ECC algorithm.

In another example (e.g., in scenarios where the ECC algorithm fails to correct the stored data or a data integrity check value satisfies a threshold criterion), the processing logic can perform error correction operations that include one or more of corrective read (CR) operations, a RAIN scheme, a forward error correction (FEC) scheme, a hybrid automatic repeat request (HARQ) scheme, etc. A RAIN scheme provides redundancy for the data stored on the memory sub-system. When host data (one or more codewords) is received from the host system to be programmed to a memory device of the memory sub-system, a memory sub-system controller can generate redundancy metadata by performing one or more exclusive-or (XOR) operations with the received host data and can use the redundancy metadata to reconstruct the host data in the event of a failure of a portion of the memory device that is storing host data. As an example, the memory sub-system controller can generate one or more RAIN standard codewords (redundancy metadata) based on an XOR operation applied to host data stored at a particular number of data locations of one or more logical units (LUNs) (e.g., a page, a block) of the memory sub-system. If a portion of a memory device storing the host data fails and the corresponding data is lost or corrupted, the memory sub-system controller can reconstruct the corrupted data by performing an XOR operation(s) among the rest of the host data and the redundancy metadata. The FEC scheme enables the memory sub-system controller to perform error corrections using a redundant error-correcting code and a data frame. The memory sub-system controller performs necessary checks based upon the redundant bits in the data. The HARQ scheme is a combination of the FEC scheme and automatic repeat request (ARQ) error-control.

At operation 240, the processing logic determines whether the source block includes at least one valid page. To determine whether the source block includes at least one valid page, the processing logic can perform a look-up, in a physical-to-logical (P2L) metadata table, of each page of the source block and determine whether any of the pages are mapped to a logical address. Responsive to determining that the source block does not include at least one valid page, the processing logic proceeds to operation 250, where the processing logic selects a new block from the media scan list. In some embodiments, the new block can be another block of the block stripe, a block of a different block stripe, etc. The new block can be selected randomly, as a next block of the block stripe, as a next block on a predetermined media scan list, etc. The processing logic then proceeds to operation 210, where the processing logic performs a data integrity check on the new block. Responsive to determining that the source block does includes at least one valid page, the processing logic proceeds to operation 260.

At operation 260, the processing logic determines whether the value of the data integrity metric obtained in operation 210 satisfies a block transfer threshold criterion (e.g., meets or exceeds a threshold value, is lower than a threshold value, etc.). The block transfer threshold value can be set to a value (determined via testing, experimentation, analytics, etc. of the memory device) reflecting that data of the source block has a relatively significant amount of errors, and needs to be corrected or refreshed, but the amount or error is not significant enough to be at risk of becoming unrecoverable. As such, the block transfer threshold criterion can be set to a value lower than the stripe transfer threshold criterion. In an example, the processing logic can determine whether an RBER value or a BEC value exceeds the block transfer threshold value.

The block transfer threshold criterion can be determined via testing, experimentation, or analytics of the memory device and set during manufacturing of the memory sub-system 110 or during programming and/or calibration of the memory sub-system 110. For example, during testing, an operator can determine a value at which the memory sub-system satisfies a condition (e.g., an error rate at data is unreadable but can be recovered using an error-handling operation (e.g., an ECC codeword), and set the threshold value to a portion of that value (e.g., a specific percentage lower than that error rate).

In some embodiments, the processing logic can perform a new data integrity check on one, some, or all of the pages of the source block. For example, the processing logic can perform the data integrity check on one or more valid pages of the source block.

If the data integrity metric satisfies the block transfer threshold criterion (e.g., BEC or RBER value is above a threshold value), indicating an error rate high enough to require the stored data to be corrected or refreshed, the processing logic proceeds to operation 270, where the processing logic triggers a media management operation on the source block. If the data integrity metric fails to satisfy the block transfer threshold criterion (e.g., BEC or RBER value is below a threshold value), the processing logic proceeds to operation 250, where the processing logic selects a new block. The processing logic then then proceeds to operation 210, where the processing logic performs a data integrity check on the new block.

At operation 270, the processing logic performs a media management operation on the source block. The media management operation (e.g., a folding operation) can copy the data stored on the source block of the block stripe to one or more available blocks of the memory sub-system. For example, the processing logic can write data stored on each valid page of the source block to a respective new page on one or more available physical locations (e.g., one or more destination blocks).

In some embodiments, prior to writing the data from the source block to the destination block(s), the processing logic can perform one or more error correction operations on the data stored on the source block.

Responsive to performing the media management operation on the source block, the processing logic can mark all of the pages of the source block as invalid. In particular, each page of the source block is marked as invalid (e.g., not mapped to a logical address) in a look-up table because the data from each page has been transferred to a new set of pages which are mapped to logical addresses.

At operation 280, the processing logic adds the source block to the media scan list. Alternatively, the processing logic maintains the source block on (e.g., does not remove from) the media scan list. Although the source block no longer includes valid pages, the data stored on the source block can be used in error correction operations for other blocks on the block stripe (e.g., in a RAIN scheme). As such, the processing logic can continue to perform data integrity checks on the source block to determine whether a value of the data integrity metric satisfies the stripe transfer threshold criterion. The processing logic then proceeds to operation 250, where the processing logic selects a new bloc from the media scan list. As discussed, the media scan list can include the source block.

Figure 3:
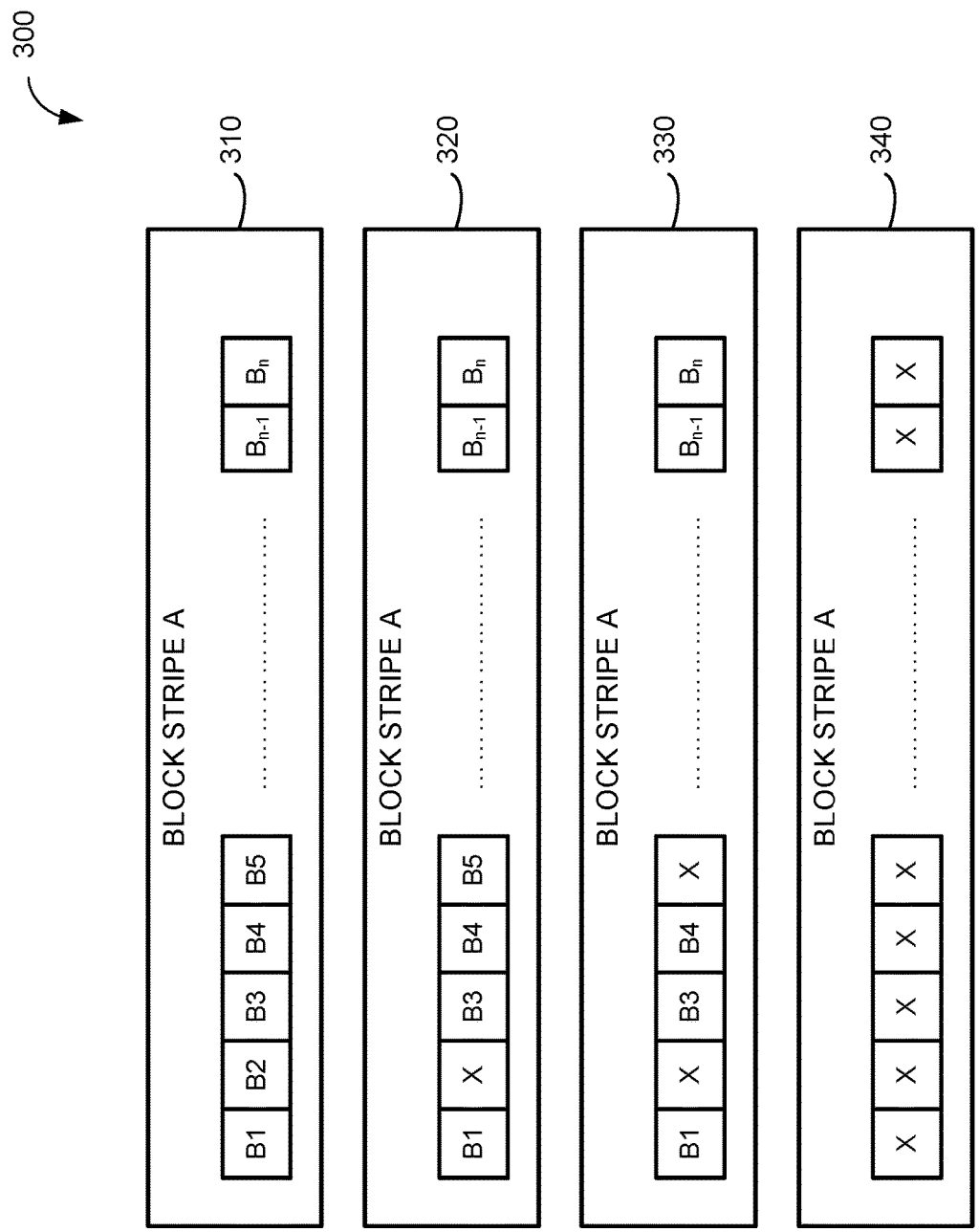
FIG. 3 is an illustration of an example block stripe configuration, according to embodiments of the present disclosure.

FIG. 3 is an illustration of an example block stripe configuration, according to embodiments of the present disclosure. In particular, block stripe A includes n amount of block (e.g., B1, B2, B3, B4, B5, $B_{n-1}$, $B_n$). Block stripes B1-$B_{n-1}$ can include host data, while block $B_n$ can include redundancy metadata for block stripe A. In configuration 310, each block of block stripe A includes one or more valid pages. During a set of data integrity checks on the blocks of block stripe A, the media management component 113 can determine that a data integrity metric value obtained from block B2 satisfies a block transfer threshold criterion (but not a stripe transfer threshold criterion). Accordingly, the media management component 113 can perform a media management operation to copy the data from the valid pages of block B2 to a new block(s), and mark all of the pages of B2 as invalid. The media management component 113 can continue to periodically perform data integrity checks on block B2, despite all of the pages of block B2 being marked as invalid.

In configuration 320, each block of block stripe A, except for block B2, includes one or more valid pages. During another set of data integrity checks on the blocks of block stripe A, the media management component 113 can determine that a data integrity metric value obtained from block B5 satisfies a block transfer threshold criterion (but not a stripe transfer threshold criterion). Accordingly, the media management component 113 can perform a media management operation to copy the data from the valid pages of block B5 to a new block(s), and mark all of the pages of B5 as invalid. The media management component 113 can continue to periodically perform data integrity checks on block B5, despite all of the pages of block B5 being marked as invalid.

In configuration 330, each block of block stripe A, except for block B2 and B5, includes one or more valid pages. During yet another set of data integrity checks on the blocks of block stripe A, the media management component 113 can determine that a data integrity metric value obtained from block B2 satisfies a stripe transfer threshold criterion. Accordingly, the media management component 113 can perform a media management operation to copy the data from all of the valid pages of the remaining blocks (e.g., block B1, block B3, block B4, and block $B_{n-1}$) to a new set of blocks, and mark all of the pages of block stripe A as invalid (as shown in configuration 340). In some embodiments, the media management component 113 can first perform error correction operations on the data using, for example, the redundancy metadata stored on block $B_n$. The media management component 113 can then return the pages of block stripe A to the free pool stored in local memory 119. The media management component 113 can generate new redundancy metadata for each new block stripe.

Figure 4:
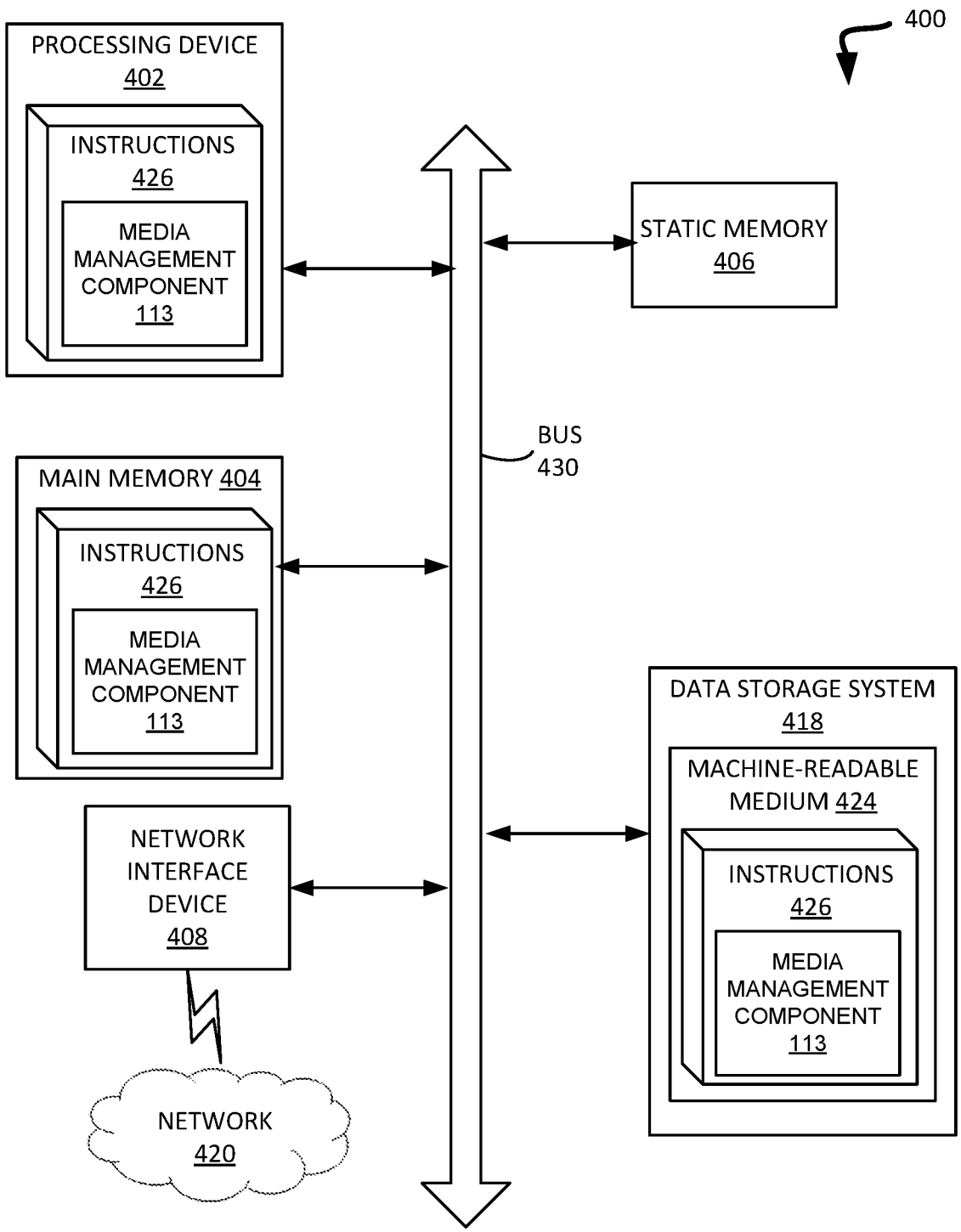
FIG. 4 is a block diagram of an example computer system in which embodiments of the present disclosure may operate.

FIG. 4 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the media management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 504 (e.g., read-only memory (ROM), flash memory, dynamic random access memory (DRAM) such as synchronous DRAM (SDRAM) or RDRAM, etc.), a static memory 406 (e.g., flash memory, static random access memory (SRAM), etc.), and a data storage system 418, which communicate with each other via a bus 430.

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 518 can include a machine-readable storage medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable storage medium 424, data storage system 418, and/or main memory 404 can correspond to the memory sub-system 110 of FIG. 1.

In one embodiment, the instructions 426 include instructions to implement functionality corresponding to a voltage bin boundary component (e.g., the media management component 113 of FIG. 1). While the machine-readable storage medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled to the memory device, to perform operations comprising;
performing a data integrity check on a set of memory cells of a source management unit of the memory device to obtain a data integrity metric value;
determining whether the data integrity metric value satisfies a first threshold;
responsive to determining that the data integrity metric value fails to satisfy the first threshold, determining whether the data integrity metric value satisfies a second threshold, where the second threshold is lower than the first threshold;
responsive to determining that the data integrity metric value satisfies the second threshold, causing the memory device to copy data from the source management unit to a destination set of pages of the memory device; and
performing a subsequent data integrity check on one or more invalid pages of the source management unit.

2. The system of claim 1, wherein the source management unit is part of a set of management units that are associated with a redundancy codeword.

3. The system of claim 2, wherein the operations further comprise:
responsive to determining that the data integrity metric value satisfies the first threshold, causing the memory device to copy data from the set of management units to a destination set of management units of the memory device.

4. The system of claim 2, wherein the operations further comprise:
responsive to determining that the data integrity metric value satisfies the first threshold, perform one or more exclusive-or (XOR) operations, using the redundancy codeword, on a first set of data stored on the set of management units to recover a second set of data stored on the set of management units.

5. The system of claim 1, wherein the data integrity metric value reflects at least one of a bit error count (BEC) value or a raw bit error rate (RBER) value.

6. The system of claim 1, wherein the operations further comprise:
responsive to determining that the data integrity metric value fails to satisfy the first threshold, determining whether the source management unit includes at least one valid page; and
responsive to determining that the source management unit includes only invalid pages, performing a new data integrity check on a new set of memory cells of a different management unit of the memory device.

7. The system of claim 2, wherein the operations further comprise:
responsive to determining that a data integrity metric value of the subsequent data integrity check fails to satisfy the first threshold, causing the memory device to copy data from the set of management units to a destination set of management units of the memory device.

8. The system of claim 1, wherein the operations further comprise:
maintaining the source management unit on a media scan list.

9. A method comprising:
performing, by a processor, a data integrity check on a set of memory cells of a source management unit of a memory device to obtain a data integrity metric value;
determining whether the data integrity metric value satisfies a first threshold;
responsive to determining that the data integrity metric value fails to satisfy the first threshold, determining whether the data integrity metric value satisfies a second threshold, where the second threshold is lower than the first threshold;
responsive to determining that the data integrity metric value satisfies the second threshold, causing the memory device to copy data from the source management unit to a destination set of pages of the memory device; and
performing a subsequent data integrity check on one or more invalid pages of the source management unit.

10. The method of claim 9, wherein the source management unit is part of a set of management units that are associated with a redundancy codeword.

11. The method of claim 10, further comprising:
responsive to determining that the data integrity metric value satisfies the first threshold, causing the memory device to copy data from the set of management units to a destination set of management units of the memory device.

12. The method of claim 10, further comprising:
responsive to determining that the data integrity metric value satisfies the first threshold, perform one or more exclusive-or (XOR) operations, using the redundancy codeword, on a first set of data stored on the set of management units to recover a second set of data stored on the set of management units.

13. The method of claim 9, wherein the data integrity metric value reflects at least one of a bit error count (BEC) value or a raw bit error rate (RBER) value.

14. The method of claim 9, further comprising:
responsive to determining that the data integrity metric value fails to satisfy the first threshold, determining whether the source management unit includes at least one valid page; and
responsive to determining that the source management unit includes only invalid pages, performing a new data integrity check on a new set of memory cells of a different management unit of the memory device.

15. The method of claim 10, further comprising:
responsive to determining that a data integrity metric value of the subsequent data integrity check fails to satisfy the first threshold, causing the memory device to copy data from the set of management units to a destination set of management units of the memory device.

16. The method of claim 9, further comprising:
maintaining the source management unit on a media scan list.

17. A non-transitory computer-readable storage medium comprising instructions that, when executed by a processing device, cause the processing device to perform operations comprising:
- performing a data integrity check on a set of memory cells of a source management unit of a memory device to obtain a data integrity metric value;
- determining whether the data integrity metric value satisfies a first threshold;
- responsive to determining that the data integrity metric value fails to satisfy the first threshold, determining whether the data integrity metric value satisfies a second threshold, where the second threshold is lower than the first threshold;
- responsive to determining that the data integrity metric value satisfies the second threshold, causing the memory device to copy data from the source management unit to a destination set of pages of the memory device; and
- performing a subsequent data integrity check on one or more invalid pages of the source management unit.

18. The non-transitory computer-readable storage medium of claim 17, wherein the source management unit is part of a set of management units that are associated with a redundancy codeword.

19. The non-transitory computer-readable storage medium of claim 18, wherein the operations further comprise:
- responsive to determining that the data integrity metric value satisfies the first threshold, causing the memory device to copy data from the set of management units to a destination set of management units of the memory device.

20. The non-transitory computer-readable storage medium of claim 18, wherein the operations further comprise:
- responsive to determining that the data integrity metric value satisfies the first threshold, perform one or more exclusive-or (XOR) operations, using the redundancy codeword, on a first set of data stored on the set of management units to recover a second set of data stored on the set of management units.

* * * * *